United States Patent
Hayashi et al.

(10) Patent No.: US 7,782,654 B2
(45) Date of Patent: Aug. 24, 2010

(54) STATIC RANDOM ACCESS MEMORY DEVICE

(75) Inventors: Takuya Hayashi, Kanagawa (JP); Yoshisato Yokoyama, Kanagawa (JP)

(73) Assignee: NEC Electronics Corporation, Kawasaki, Kanagawa (JP)

( * ) Notice: Subject to any disclaimer, the term of this patent is extended or adjusted under 35 U.S.C. 154(b) by 161 days.

(21) Appl. No.: 12/149,500

(22) Filed: May 2, 2008

(65) Prior Publication Data

US 2008/0278993 A1 Nov. 13, 2008

(30) Foreign Application Priority Data

May 9, 2007 (JP) ............................. 2007-124475
Mar. 19, 2008 (JP) ............................. 2008-070705

(51) Int. Cl.
*G11C 11/00* (2006.01)
(52) U.S. Cl. ..................................... 365/154
(58) Field of Classification Search ................. 365/154, 365/156

See application file for complete search history.

(56) References Cited

U.S. PATENT DOCUMENTS

2007/0279966 A1 * 12/2007 Houston .................... 365/154

FOREIGN PATENT DOCUMENTS

JP 2006-66588 3/2006

* cited by examiner

*Primary Examiner*—Hoai V Ho
*Assistant Examiner*—Anthan T Tran
(74) *Attorney, Agent, or Firm*—McGinn IP Law Group, PLLC (57) ABSTRACT

Additional transistors P1 and P2 which are PMOS transistors are connected to load transistors PL1 and PL2 which are PMOS transistors such that drain electrodes of the additional transistors P1 and P2 and drain electrodes of the load transistors PL1 and PL2 are connected at a node 1 and a node 2 while gate electrodes of the additional transistors P1 and P2 and gate electrodes of the load transistors PL1 and PL2 are connected at the node 1 and the node 2. A source electrode of the additional transistor P1 is connected to an additional transistor control circuit, which is provided for each column. The additional transistor control circuit circuit sets control signals S1 and S2 to the H level in other times than data write so that the additional transistor P1 or P2 compensates the load transistor PL1 or PL2, thereby increasing the static margin. In data write, the additional transistor control circuit sets the control signals S1 and S2 to the low level, thereby preventing the additional transistors from hindering the data write, and thus increasing the write margin.

14 Claims, 8 Drawing Sheets

STATIC RANDOM ACCESS MEMORY DEVICE

BACKGROUND OF THE INVENTION

1. Field of the Invention

The present invention relates to a semiconductor memory device, in particular, a static random access memory device.

2. Description of the Related Art

Figure 4:
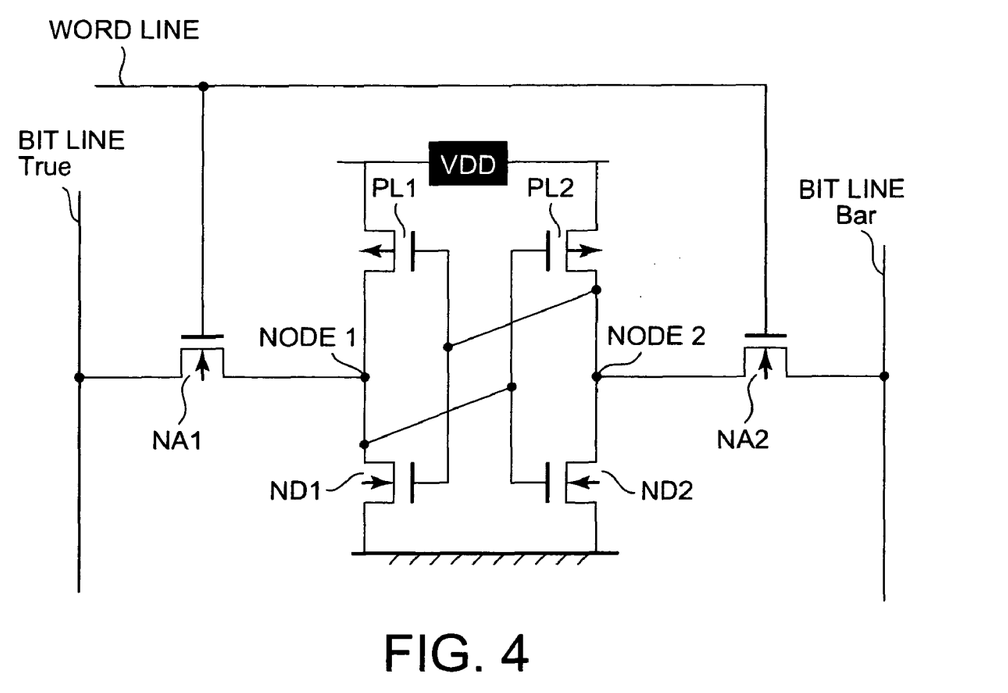
FIG. 4 is a circuit diagram of a conventional SRAM cell formed of six transistors.

FIG. 4 is a circuit diagram of a common conventional static random access memory (SRAM) cell.

The SRAM cell has a pair of driver transistors ND1 and ND2, which are NMOS transistors, a pair of load transistors PL1 and PL2, which are PMOS transistors, and a pair of access transistors NA1 and NA2, which are NMOS transistors.

Source electrodes of the driver transistors ND1 and ND2 are both connected to a ground (GND). Source electrodes of the load transistors PL1 and PL2 are both connected to a power supply VDD. A drain electrode of the driver transistor ND1 is connected to a drain electrode of the load transistor PL1. This connection point will hereinafter be referred to as "node 1". A drain electrode of the driver transistor ND2 is connected to a drain electrode of the load transistor PL2. This connection point will hereinafter be referred to as "node 2". A gate electrode of the driver transistor ND1 and a gate electrode of the load transistor PL1 are both connected to the node 2. A gate electrode of the driver transistor ND2 and a gate electrode of the load transistor PL2 are both connected to the node 1. A COMS inverter that includes the driver transistor ND1 and the load transistor PL1 and a CMOS inverter that includes the driver transistor ND2 and the load transistor PL2 constitute a latch circuit. One of source and drain electrodes of the access transistor NA1 is connected to the node 1 and the other is connected to a bit line True. One of source and drain electrodes of the access transistor NA2 is connected to the node 2 and the other is connected to a bit line Bar. Gate electrodes of the access transistors NA1 and NA2 are both connected to a word line.

The SRAM cell accomplishes high-speed and stable operation by usually setting the current driving ability ratio of the access transistors NA1 and NA2, which are activated by the word line, and the driver transistors ND1 and ND2, which constitute the latch portion, to approximately 1:3, and setting the current driving ability of the load transistors PL1 and PL2, which constitute the latch portion, equal to or lower than that of the access transistors NA1 and NA2.

The static noise margin, which is an indicator of the stability of data stored in a memory cell, is improved by setting the current driving ability of the load transistors PL1 and PL2 greater than that of the driver transistors ND1 and ND2.

However, setting the current driving ability of the load transistors PL1 and PL2 greater than that of the driver transistors ND1 and ND2 increases the ability of the nodes to keep to High and makes the discharging of the nodes (the reversal from High to Low) difficult in data write, which means less write margin.

In short, the static noise margin and the write margin have a trade-off relationship, and improving the two simultaneously is not easy.

Figure 5:
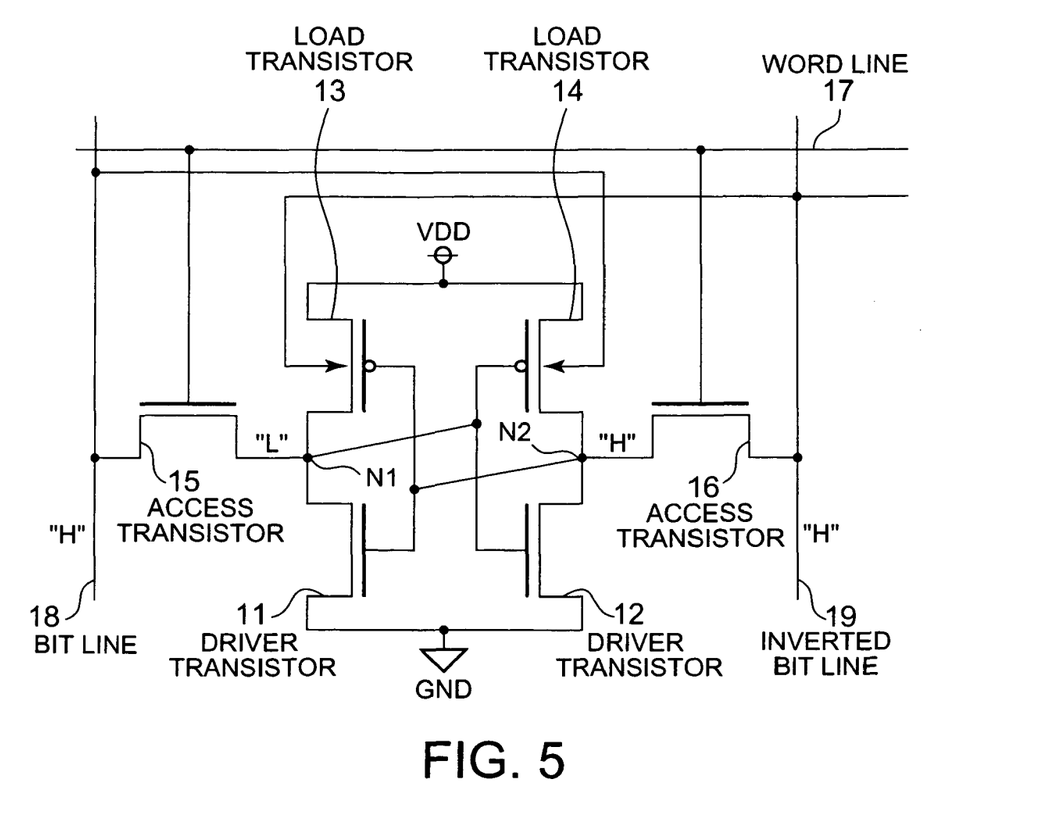
FIG. 5 is a circuit diagram of another conventional SRAM cell.

FIG. 5 is a structural diagram of an SRAM cell with an improved statistic noise margin which is disclosed in JP 2006-066588 A.

The SRAM cell has a pair of driver transistors 11 and 12, which are NMOS transistors, a pair of load transistors 13 and 14, which are PMOS transistors, and a pair of access transistors 15 and 16, which are NMOS transistors.

Source electrodes of the driver transistors 11 and 12 are both connected to a ground (GND). Source electrodes of the load transistors 13 and 14 are both connected to a power supply VDD. A drain electrode of the driver transistor 11 is connected to a drain electrode of the load transistor 13 and to a drain electrode of the access transistor 15. This connection point will hereinafter be referred to as "node N1". A source electrode of the access transistor 15 is connected to a bit line 18 and its gate electrode is connected to a word line 17. A drain electrode of the driver transistor 12 is connected to a drain electrode of the load transistor 14 and to a drain electrode of the access transistor 16. This connection point will hereinafter be referred to as "node N2". A source electrode of the access transistor 16 is connected to an inverted bit line 19 and its gate electrode is connected to the word line 17. A gate electrode of the driver transistor 11 and a gate electrode of the load transistor 13 are both connected to the node N2. Agate electrode of the driver transistor 12 and a gate electrode of the load transistor 14 are both connected to the node N1.

The SRAM memory cell shown in FIG. 5 has a bulk type structure in which the bit line 18 is connected to an well of the load transistor 14 and the inverted bit line 19 is connected to an well of the load transistor 13. The node N1 is at the L level whereas the node N2 is at the H level. In data read, the bit line 18 and the inverted bit line 19 are precharged to the H level. The rise to the H level of the word line 17 causes a column current to flow in the driver transistor 11. When the electric potential of the bit line 18 changes to the L level, the electric potential of the well of the load transistor 14 concurrently changes to the L level. This prevents the electric potential of the node N2 from dropping much from the H level when the current driving ability of the load transistor 14 is improved and noise or the like causes a rise in electric potential of the node N1, which is accompanied by a slight on operation of the driver transistor 12. Accordingly, the electric potential difference between the bit lines 18 and 19 can be read and a malfunction in data read is avoided.

An analysis by the inventors of the present invention, however, has revealed the following:

To build the conventional memory cell having the circuit structure of FIG. 5 from silicon, the wells of the load transistors 13 and 14 which are PMOS transistors have to be separated because of their differing electric potentials. Since transistors are generally formed on a P-type silicon substrate, the well separation requires separating N wells from each other. The N wells need to be separated at a minimum distance that does not cause a short-circuit between the N wells even when the separated N wells have different electric potentials. This presents a problem in that the area of the SRAM cell is greatly increased.

There is another type of SRAM in which a precharge transistor connected to a pair of bit lines at non-selected addresses is kept on during read operation in order to speed up the read operation by eliminating the time for precharging for the next data read. The static noise margin of this type of SRAM cannot be improved with the SRAM cell structure disclosed in JP 2006-066588 A. This is because the electric potential of the bit lines in the SRAM cell at non-selected addresses does not change to the L level and accordingly the well electric potential of the load transistor does not change to the L level, which means no improvement in current driving ability.

The goal to be accomplished is therefore to increase the static noise margin and the write margin both at the same time while avoiding a significant increase in cell area of a static semiconductor memory device.

SUMMARY OF THE INVENTION

The present invention seeks to improve upon those problems at least in part.

According to embodiments of the present invention, there is provided a static semiconductor memory device including: an SPAM cell including: a first CMOS inverter which contains a PMOS transistor and an NMOS transistor, a drain of the PMOS transistor and a drain of the NMOS transistor being connected at a first node, a gate of the PMOS transistor and a gate of the NMOS transistor being connected at a second node; a second CMOS inverter which contains a PMOS transistor and an NMOS transistor, a drain of the PMOS transistor and a drain of the NMOS transistor being connected at the second node, a gate of the PMOS transistor and a gate of the NMOS transistor being connected at the first node; a first access transistor with source and drain ends one of which is connected to the first node and another of which is connected to a first bit line; a second access transistor with source and drain ends one of which is connected to the second node and another of which is connected to a second bit line; a first additional transistor with source and drain ends one of which is connected to the first node and a gate connected to the second node; and a second additional transistor with source and drain ends one of which is connected to the second node and a gate connected to the first node; and an additional transistor control circuit to which other ends of the source and drain ends of the first additional transistor and the second additional transistor are connected.

According to the above embodiment, one of the two additional transistors that is connected to a node shifting from the H level to the L level is controlled such that the source electrode of this additional transistor is at the L level for the duration of a word line activation period in the node's level shift, and the write margin is increased by lowering the electric potential of this node.

Also, the static margin in data read and in a data hold state is increased by setting the source electrodes of both of the additional transistors to the H level and increasing the on current with a current that passes through the additional transistor whose drain electrode is connected to an H level node.

The write margin and the static noise margin are secured also by controlling the additional transistors with the additional transistor control circuit.

BRIEF DESCRIPTION OF THE DRAWINGS

The above and other objects, advantages and features of the present invention will be more apparent from the following description of certain preferred embodiments taken in conjunction with the accompanying drawings, in which.

DETAILED DESCRIPTION OF THE PREFERRED EMBODIMENTS

The invention will be now described herein with reference to illustrative embodiments. Those skilled in the art will recognize that many alternative embodiments can be accomplished using the teachings of the present invention and that the invention is not limited to the embodiments illustrated for explanatory purposes.

Embodiments of the present invention will be described now with reference to the drawings.

First Embodiment

Figure 1:
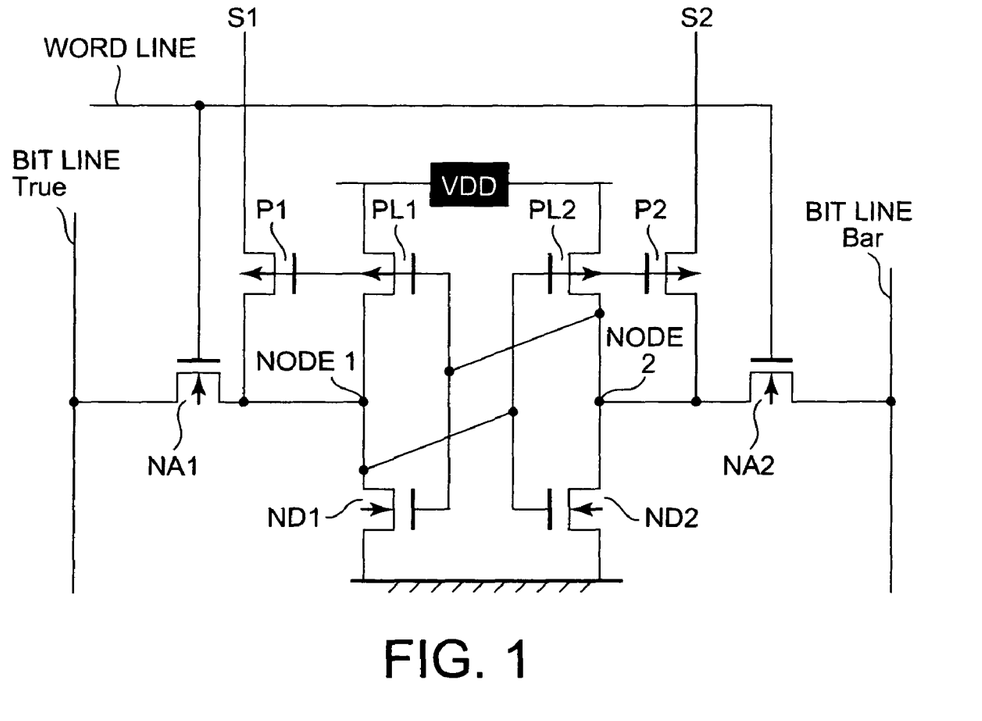
FIG. 1 is a circuit diagram of an SRAM cell according to a first embodiment of the present invention.

FIG. 1 is a circuit diagram of an SRAM cell according to a first embodiment of the present invention.

The SRAM cell shown in FIG. 1 has a pair of driver transistors ND1 and ND2, which are NMOS transistors, a pair of load transistors PL1 and PL2, which are PMOS transistors, and a pair of access transistors NA1 and NA2, which are NMOS transistors.

Source electrodes of the driver transistors ND1 and ND2 are both connected to a ground (GND). Source electrodes of the load transistors PL1 and PL2 are both connected to a power supply VDD. A drain electrode of the driver transistor ND1 is connected to a drain electrode of the load transistor PL1. This connection point will hereinafter be referred to as "node 1". A drain electrode of the driver transistor ND2 is connected to a drain electrode of the load transistor PL2. This connection point will hereinafter be referred to as "node 2". A gate electrode of the driver transistor ND1 and a gate electrode of the load transistor PL1 are both connected to the node 2. A gate electrode of the driver transistor ND2 and a gate electrode of the load transistor PL2 are both connected to the node 1. A CMOS inverter that includes the driver transistor ND1 and the load transistor PL1 and a CMOS inverter that includes the driver transistor ND2 and the load transistor PL2 constitute a latch circuit. One of source and drain electrodes of the access transistor NA1 is connected to the node 1 and the other is connected to a bit line True. One of source and drain electrodes of the access transistor NA2 is connected to the node 2 and the other is connected to a bit line Bar. Gate electrodes of the access transistors NA1 and NA2 are both connected to a word line.

One of source and drain electrodes of a PMOS transistor P1 is connected to the node 1 and the other is connected to a control signal (line) S1. A gate electrode of the PMOS transistor P1 is connected to the node 2. One of source and drain electrodes of a PMOS transistor P2 is connected to the node 2 and the other is connected to a control signal (line) S2. A gate electrode of the PMOS transistor P2 is connected to the node 1.

The PMOS transistors P1 and P2 and the load transistors PL1 and PL2 can be formed in the same N well.

Control needed in write operation, read operation, and hold operation are executed by generating the control signals S1 and S2 from the logic of a write enable signal, a column select signal, a data input signal, and a row select signal.

When the electric potential of the node 1 is "H", the electric potential of the node 2 is "L", and the electric potential of the node 2 is "H" when the electric potential of the node 1 is "L".

Figure 2:
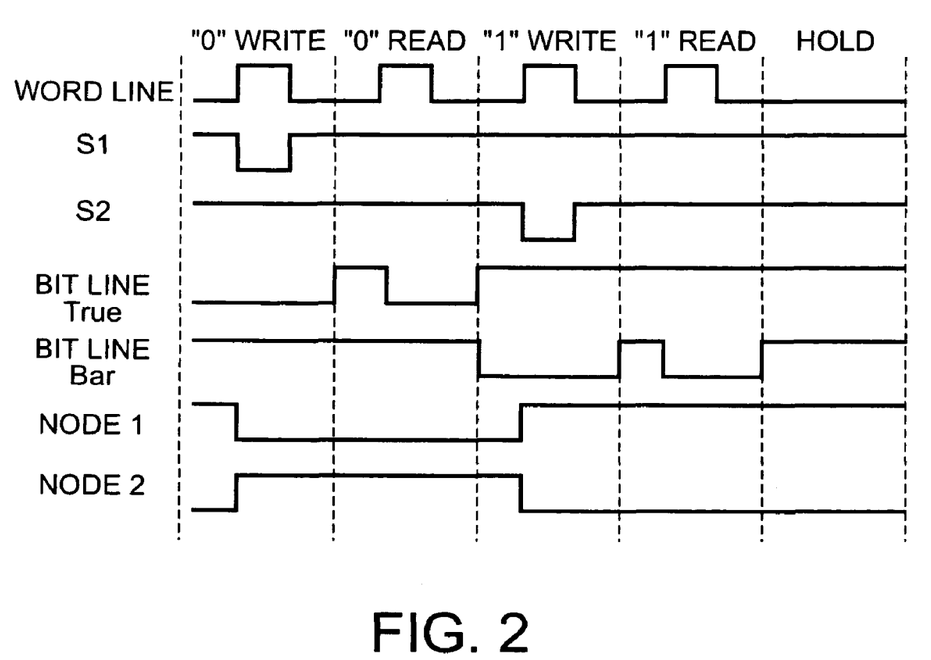
FIG. 2 is a timing chart of the SRAM cell according to the first embodiment of the present invention.

FIG. 2 is a timing chart of the SRAM cell according to the first embodiment of the present invention.

Referring to a "'0' write" section of FIG. 2, a description will be given on a case of changing the electric potential of the node 1 from the H level to the L level. When the electric potential of the node 1 is at the H level, the transistor P1 is on and the transistor P2 is off. The control signal S1 is set to the L level before the word line shifts to the H level, whereas the control signal S2 is kept at the H level. As the control signal S1 is set to the L level, the electric potential of the node 1 drops due to the on resistance division of the transistors P1 and PL1. A write buffer keeps the bit line True at the L level and the bit line Bar at the H level, causing the node 1 to discharge to the GND through a path that leads from the access transistor NA1 to the write buffer, and the node 1 shifts to the L level as a result.

Referring to a "'0' read" section of FIG. 2, a description will be given on the operation of reading data out of the node 1 when the electric potential of the node 1 is at the L level. At this point, the transistor P1 is off and the transistor P2 is on. First, the bit line True is precharged to the H level, then the word line is brought to the H level, and the control signals S1 and S2 are set to the H level. This causes the discharging of the bit line True to the GND through the access transistor NA1 and the driver transistor ND1, sending a signal to a sense amplifier. The bit line Bar keeps to the H level during this.

The operation in a "'1' write" section of FIG. 2 can be described by the description on the "'0' write" given above, if the node 1, the bit line True, and the control signal S1 in the description are substituted with the node 2, the bit line Bar, and the control signal S2, respectively.

Similarly, the operation in a "'1' read" section of FIG. 2 can be described by the description on the "'0' read" given above if the description is given with the same substitution.

Referring to a "hold" section of FIG. 2, a description will be given on a case of holding data in the latch portion, in other words, executing neither write nor read. Data in the latch portion is kept by setting the word line to the L level while setting the control signals S1 and S2 to the H level.

The static noise margin in data read and in the data hold state increases when the PMOS transistors P1 and P2 whose source electrodes are connected to the control signals S1 and S2 at the H level cause an increase in on current in parallel PMOS transistors (P1 and PL1, or P2 and PL2) whose drain electrodes are connected to the node 1 or the node 2 that is at the H level.

The write margin in data write increases when the control signals S1 and S2 are controlled such that the electric potential of the node 1 or the node 2 is dropped from the H level by an amount corresponding to the on resistance division of serial PMOS transistors (P1 and PL1, or P2 and PL2).

In short, the static noise margin and the write margin, which have a trade-off relationship conventionally, can be increased at the same time by using the control signals S1 and S2 to set the characteristics balance of the latch portion in data read and in data hold differently from the one in data write.

Also, since this embodiment does not require well separation which leads to an increase in area, the cell area is increased only slightly despite the addition of two wiring lines, the control signals S1 and S2.

Further, the control signals S1 and S2 independent of the electric potential of the bit lines ensure that, when the read operation speed-up method that keeps a precharge transistor in a non-selected cell turned on during data read is employed, the static noise margin is improved as in the normal operation mode.

Embodiment 2

Figure 6:
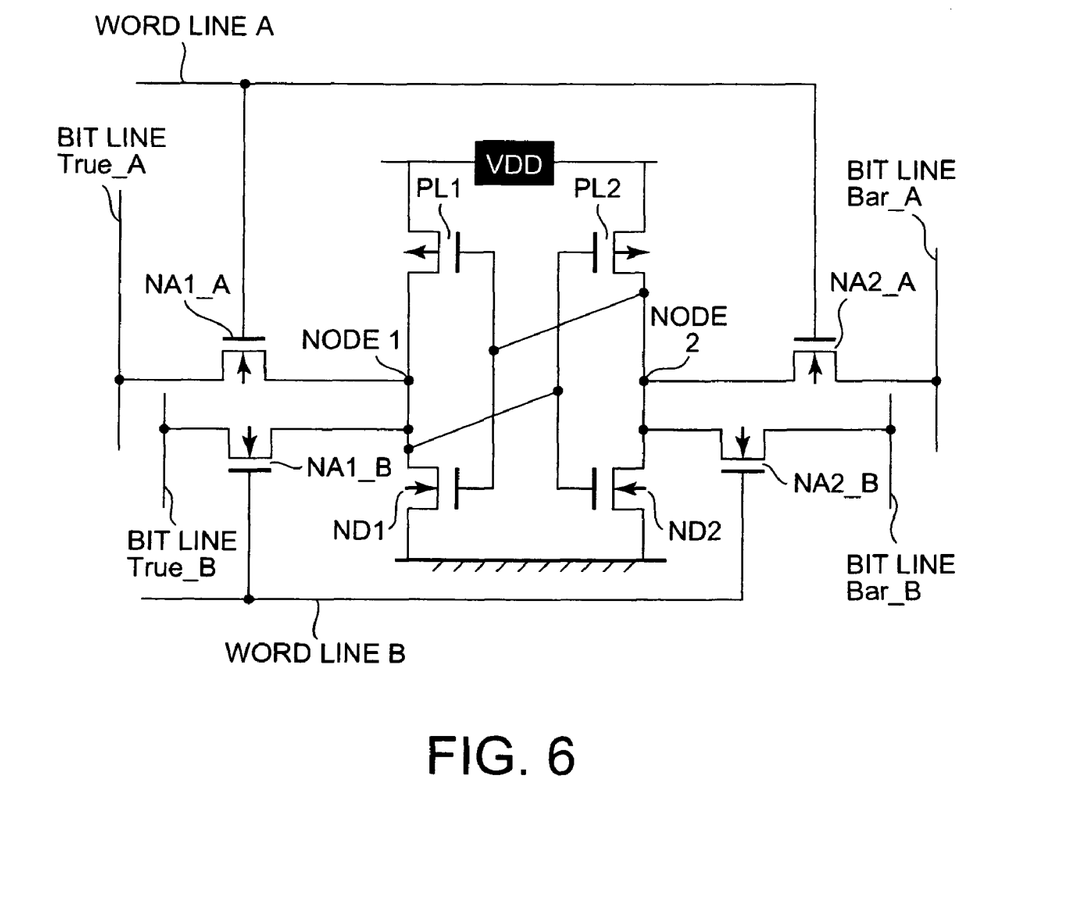
FIG. 6 is a circuit diagram of a conventional dual port SRAM cell formed of eight transistors.

FIG. 6 is a structural diagram of a conventional dual port SRAM formed of eight transistors and capable of reading and writing data through each of the two ports.

Figure 3:
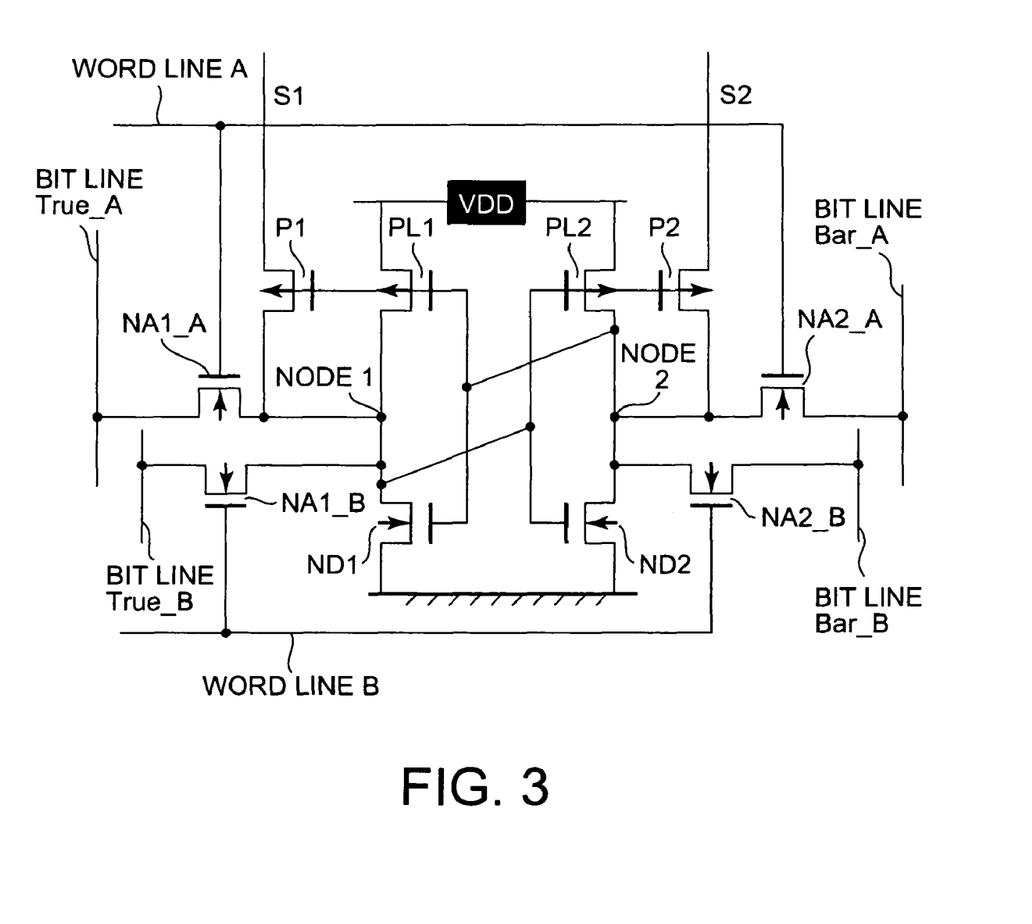
FIG. 3 is a circuit diagram of an SRAM cell according to a second embodiment of the present invention.

FIG. 3 is a cell structural diagram for a modified version of the dual port SRAM of FIG. 6 to which the present invention is applied.

In the dual port SRAM, as in a single port SRAM (see FIG. 1), drains and gates of the two PMOS transistors P1 and P2 are connected to the node 1 and the node 2 such that the drain and gate of the transistor P1 are not connected to the same nodes that are connected to the drain and gate of the transistor P2, respectively. Sources of the transistors P1 and P2 are connected to the control signals S1 and S2. Stable operation is accomplished in the dual port SPAM by increasing the static noise margin in data read and in the data hold state and the write margin as in the single port SRAM.

When the present invention is applied to a dual port SRAM (WR+WR) formed of eight transistors, the ratio of the area increase due to the addition of two PMOS transistors, P1 and P2, is smaller than when the present invention is applied to a single port SRAM.

Embodiment 3

A variation of the above-mentioned additional transistor control circuit for controlling the additional transistors will be described next. In the above embodiments, the control signals S1 and S2 are generated by adding the row select signal to the logic as well as the write enable signal, the column select signal, and the data input signal. By thus adding the row select signal to the logic as well as other signals, the control signals S1 and S2 can be controlled to be brought to the L level only when the node 1 or the node 2 shifts from the H level to the L level.

An effect substantially equal to the one that is obtained when the row select signal is added to the logic for controlling the control signals S1 and S2 can be obtained without adding the row select signal to the logic. In this case, the additional transistor control circuit which controls the control signals S1 and S2 can have a simpler structure and, moreover, SRAM cells that share a bit line can share the same additional transistor control circuit.

Figure 7:
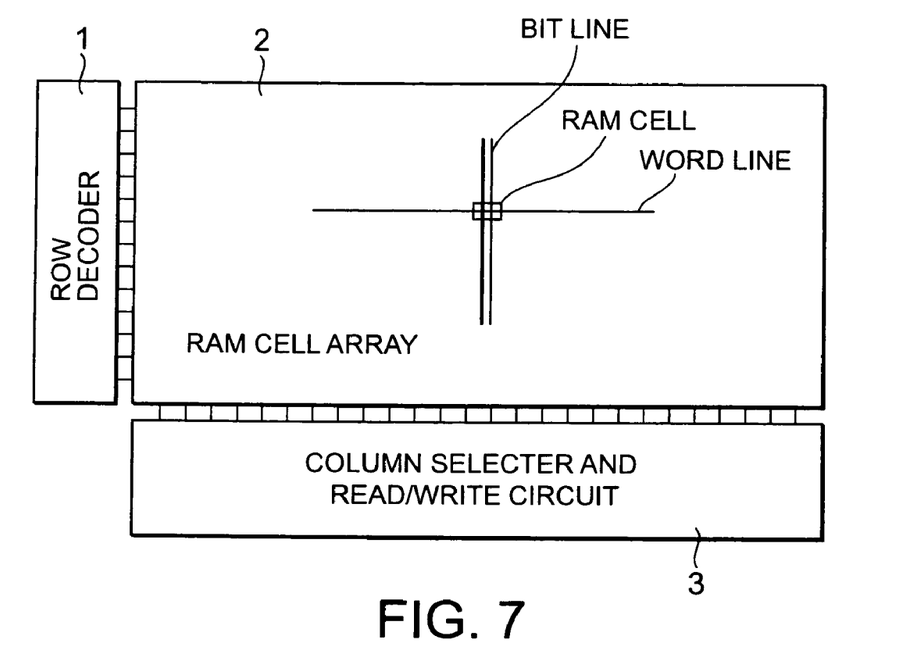
FIG. 7 is a block diagram showing an overview of a static semiconductor memory device according to a third embodiment of the present invention.

FIG. 7 is a block diagram showing an overview of a static semiconductor memory device in which an additional transistor control circuit is shared between SRAM cells that share a bit line. In FIG. 7, multiple word lines are output from a row decoder 1 to a RAM cell array 2. Multiple bit line pairs each constituted of a bit line True and a bit line Bar extend from a "column selector and read/write control circuit 3" to the RAM cell array 2. The SRAM cell described in the first embodiment of the present invention is at each intersection point between the multiple word lines and the multiple bit line pairs, and the thus arranged SRAM cells form a matrix pattern. In this embodiment, an additional transistor control circuit 4 for controlling additional transistors is provided within the "column selector and read/write control circuit 3". As many control signals S1 and S2 as the number of the bit line pairs extending from the "column selector and read/write control circuit 3" are output the RAM cell array 2 (omitted from the drawing). The wiring lines of the control signals S1 and S2 in the RAM cell array 2 may be laid parallel to the bit line pairs.

Figure 8:
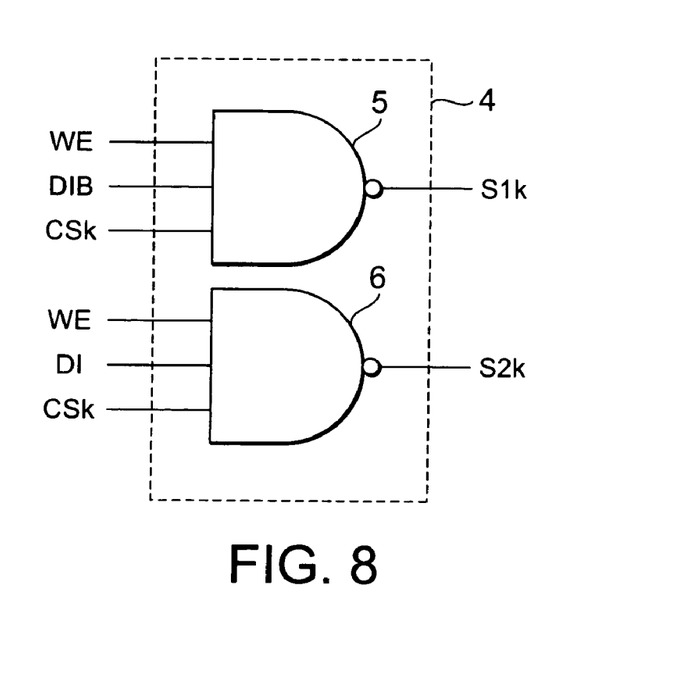
FIG. 8 is a circuit diagram of an additional transistor control circuit according to the third embodiment of the present invention.

FIG. 8 is a circuit diagram of the additional transistor control circuit 4. The additional transistor control circuit 4 is, as mentioned above, provided in the "column selector and read/write control circuit 3". A NAND gate 5 inputs a write enable signal WE, a data input inversion signal DIB, and a k-th column select signal CSk, and outputs a k-th S1 signal S1k.

Similarly, a NAND gate 6 inputs the write enable signal WE, a data input signal DI, and the k-th column select signal CSk, and outputs the k-th S1 signal S1k. The CSk signal is one of n column select signals which are generated by decoding column addresses, and the "column selector and read/write control circuit 3" is provided with n additional transistor control circuits 4 when n pairs of bit lines extend from the "column selector and read/write control circuit 3" to the RAM cell array 2.

With this structure in which multiple SRAM cells that are connected to the same bit line pair shares one additional transistor control circuit 4, there are cases where the control signals S1 and S2 are controlled to be brought to the L level for cells in which data is not written directly as well as cells in which data is written. However, the word lines shift to the H level only for cells in which data is written, and the shift of the control signals S1 and S2 to the L level does not cause the destruction of stored data or other such problems for the cells in which data is not written.

Embodiment 4

Figure 9:
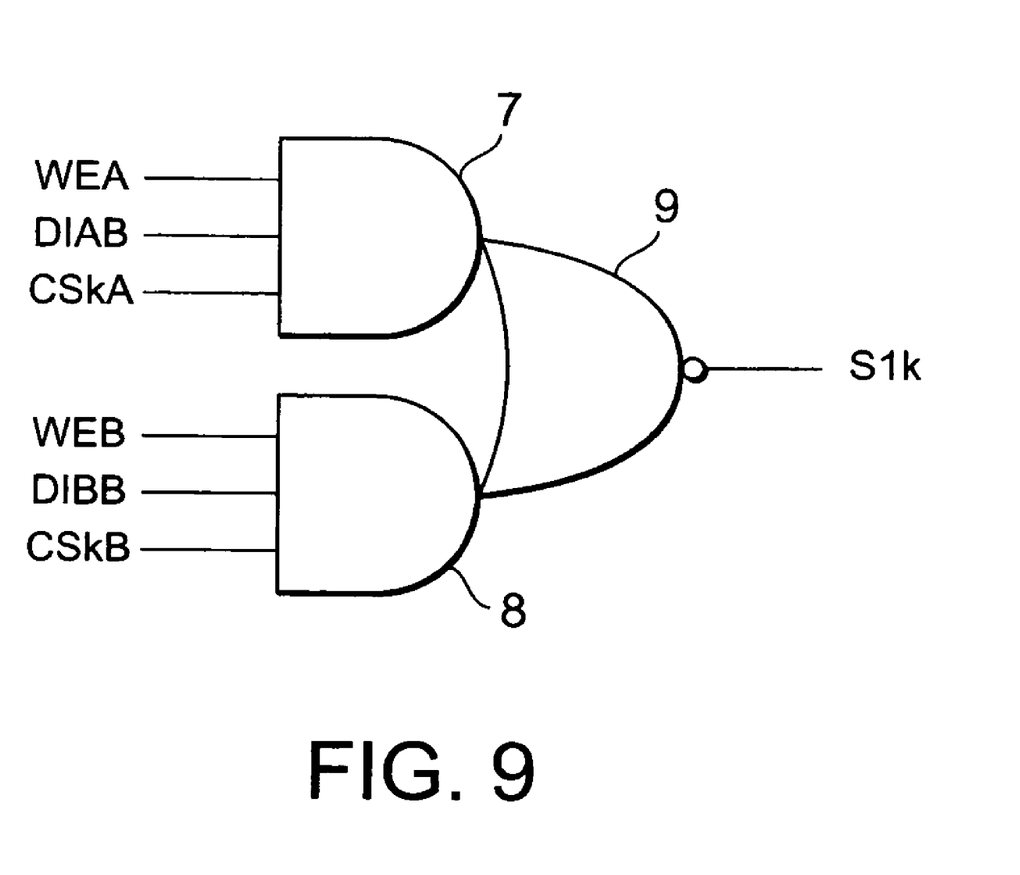
FIG. 9 is a circuit diagram of an additional transistor control circuit of a dual port SRAM according to a fourth embodiment of the present invention.

FIG. 9 shows an example of an additional transistor control circuit of a dual port SRAM. Shown in FIG. 9 is a circuit diagram of an additional transistor control circuit that generates a control signal S1k out of control signals S1k and S2k, which are used to control k-th column SRAM cells out of n columns of dual port SRAM cells. The additional transistor control circuit shown in FIG. 9 includes an AND portion 7, which generates a control signal relevant to access from a port A, an AND portion 8, which generates a control signal relevant to access from a port B, and a NOR portion 9, which synthesizes control signals generated by the AND portions 7 and 8.

The AND portion 7 inputs a write enable signal WEA for the port A, a data input inversion signal DIAB for the port A, a column selector signal CSkA for selecting k-th column cells in access relevant to the port A, and outputs the H level when data 0 is written in one of the k-th column cells through the port A.

The AND portion 8 inputs a write enable signal WEB for the port B, a data input inversion signal DIBB for the port B, a k-th column selector signal CSkB for the port B, and outputs the H level when data 0 is written in one of the k-th column cells through the port B.

The NOR portion 9 synthesizes signals generated by the AND portions 7 and 8, and outputs the low level as the S1k signal when data 0 is written in one of the k-th column cells through the port A or the port B. Structured as above, the additional transistor control circuit can output control signals to additional transistors in a dual port SRAM as well as in a single port SRAM.

In the case where a dual port SRAM is laid out such that a "column selector and read/write control circuit" of the port A and a "column selector and read/write control circuit" of the port B are set apart from each other, the AND portions 7 and 8 may be placed separately from each other by putting the AND portion 7 in the "column selector and read/write control circuit" of the port A and putting the AND portion 8 in the "column selector and read/write control circuit" of the port B.

It is apparent that the present invention is not limited to the above embodiments, but may be modified and changed without departing from the scope and spirit of the invention.

What is claimed is:

1. A static random access memory device comprising:
an SRAM cell comprising:
a first CMOS inverter comprising a first PMOS transistor and a first NMOS transistor, drains of said first PMOS and NMOS transistors being coupled to a first node, gates of said first PMOS and NMOS PMOS transistors being coupled to a second node;
a second CMOS inverter comprising a second PMOS transistor and a second NMOS transistor, a drain of said second PMOS and NMOS transistors being coupled to said second node, gates of said second PMOS and NMOS transistors being coupled to said first node;
a first access transistor comprising one of source/drain coupled to said first node, and the other of source/drain coupled to a first bit line;
a second access transistor comprising one of source/drain coupled to said second node, and the other of source/drain coupled to a second bit line;
a first additional transistor comprising one of source/drain coupled to said first node, and a gate coupled to said second node; and
a second additional transistor comprising one of source/drain coupled to said second node, and a gate coupled to said first node; and
an additional transistor control circuit coupled to the others of source/drain of said first and second additional transistors,
wherein said additional transistor control circuit is configured to receive a write enable signal, a column select signal, and a data input signal, and to generate each control signal for said first and second additional transistors.

2. The static random access memory device of claim 1, wherein each of said first and second access transistors comprises an NMOS transistor, and each of said first and second additional transistors comprises an PMOS transistor.

3. A static random access memory device, comprising:
a plurality of bit line pairs, each of said bit line pairs comprising a first bit line and a second bit line;
a plurality of word lines, said plurality of word lines and said plurality of bit line pairs being arranged in a matrix;
a plurality of static random access memory cells each arranged corresponding to each node of said matrix, each of said plurality of said static random access memory cells comprising:
a first CMOS inverter comprising a first PMOS transistor and a first NMOS transistor, drains of said first PMOS and NMOS transistors being coupled to a first node, gates of said first PMOS and NMOS transistors being coupled to a second node;
a second CMOS inverter comprising a second PMOS transistor and a second NMOS transistor, drains of said second PMOS and NMOS transistors being coupled to said second node, gates of said second PMOS and NMOS transistors being coupled to said first node;
a first access transistor comprising one of source/drain being coupled to said first node, the other of source/drain being coupled to a corresponding first bit line of corresponding bit line pairs of said plurality of bit line pairs, and a gate being coupled to a corresponding word line of said plurality of word lines;

a second access transistor comprising one of source/drain coupled to said second node, the other of source/drain being coupled to a corresponding second bit line of said corresponding bit line pairs, and a gate being coupled to said corresponding word line;

a first additional transistor comprising one of source/drain coupled to said first node, and a gate coupled to said second node; and a second additional transistor comprising one of source/drain coupled to said second node, and a gate coupled to said first node; and a plurality of additional transistor control circuits each coupled to the others of source/drain of said first and second additional transistors of corresponding static random access memory cells of said plurality of static random access memory cells, wherein each of said additional transistor control circuits is configured to receive a write enable signal, a corresponding column select signal, and a data input signal, and to generate each control signal for said first and second additional transistors.

4. The static random access memory device of claim 3, wherein each of said plurality of additional transistor control circuits is arranged corresponding to each of said plurality of bit line pairs, and is configured to control a plurality of static random access memory cells coupled to a corresponding bit line pairs.

5. The static random access memory device of claim 3 wherein each of said first and second access transistors comprises an NMOS transistor, and each of said first and second additional transistors comprises PMOS transistor.

6. The static random access memory device of claim 3, wherein said static random access memory device comprises a dual port memory device, each of said bit line pairs being first bit line pairs, and each of said word lines being a first word line, and wherein said static random access memory device further comprises:

a plurality of second bit line pairs, each of said second bit line pairs comprising a third bit line and a fourth bit line, said third and fourth bit lines corresponding to said first and second bit lines; and a plurality of second word lines, each of said second word lines corresponding to said first word line; and wherein each of said static random access memory cells further comprises:

a third access transistor comprising one of source/drain coupled to said first node, the other of source /drain being coupled to a corresponding third bit line, and a gate being coupled to a corresponding second word line; and a fourth access transistor comprising one of source/drain coupled to said second node, the other of source/drain being coupled to a corresponding fourth bit line, and a gate coupled to said corresponding second word line.

7. The static random access memory device of claim 6, wherein each of said additional transistor control circuits is configured to receive a write enable signal, a corresponding column select signal, and a data input signal, and to generate control signals for said first and second additional transistors.

8. The static random access memory device of claim 6, wherein each of said plurality of additional transistor control circuits is arranged corresponding to each of said plurality of first bit line pairs, and is configured to control a plurality of static random access memory cells coupled to a corresponding bit line pair.

9. The static random access memory device of claim 6, wherein each of said first to fourth access transistors comprises an NMOS transistor, and each of said first and second additional transistors comprises a PMOS transistor.

10. A static semiconductor memory device with a latch circuit that includes a first CMOS inverter and a second CMOS inverter, comprising:

a first additional transistor which comprises a PMOS transistor, a gate electrode of the first additional transistor being connected to a gate electrode of a load transistor which comprises a PMOS transistor constituting the first CMOS inverter, a drain electrode of the first additional transistor being connected to a drain electrode of the load transistor at a first node;

a second additional transistor which comprises a PMOS transistor, a gate electrode of the second additional transistor being connected to a gate electrode of another load transistor which comprises a PMOS transistor constituting the second CMOS inverter, a drain electrode of the second additional transistor being connected to a drain electrode of the another load transistor at a second node, wherein the first additional transistor is controlled such that its source electrode is at an L level only during a word line activation period in a shift of the first node from an H level to the L level, and wherein the second additional transistor is controlled such that its source electrode is at the L level only during a word line activation period in a shift of the second node from the H level to the L level.

11. The static semiconductor memory device according to claim 10, wherein the static semiconductor memory device is structured by adding the first additional transistor and the second additional transistor to a single port SRAM including six transistors.

12. The static semiconductor memory device according to claim 10, wherein the static semiconductor memory device is structured by adding the first additional transistor and the second additional transistor to a dual port SRAM including eight transistors.

13. The static semiconductor memory device according to claim 10, further comprising an additional transistor control circuit, wherein the source electrodes of the first additional transistor and the second additional transistor are connected to the additional transistor control circuit.

14. The static semiconductor memory device according to claim 13, wherein, upon reception of a signal for controlling operation of writing data in the static semiconductor memory device, and reception of a write address signal and a write data signal, the additional transistor control circuit outputs signals for controlling the first additional transistor and the second additional transistor to the respective source electrodes of the first additional transistor and the second additional transistor.

* * * * *